United States Patent [19]
Weiss et al.

[11] Patent Number: 4,536,884
[45] Date of Patent: Aug. 20, 1985

[54] PLASMA PINCH X-RAY APPARATUS

[75] Inventors: Arnold Weiss, Minneapolis, Minn.; Herman P. Schutten; Louis Cartz, both of Milwaukee, Wis.; Gordon B. Spellman, Mequon, Wis.; Stanley V. Jaskolski, Sussex, Wis.; Peter H. Wackman, deceased, late of Wauwatosa, Wis., by Connie M. Wackman, personal representative

[73] Assignee: Eaton Corporation, Cleveland, Ohio

[21] Appl. No.: 420,558

[22] Filed: Sep. 20, 1982

[51] Int. Cl.³ .................. H01J 35/00; H05B 31/22
[52] U.S. Cl. ................................ 378/119; 378/121
[58] Field of Search ............ 378/119, 122, 123, 34, 378/121; 313/231.61; 356/313, 314, 316, 318; 73/28

[56] References Cited

U.S. PATENT DOCUMENTS

| | | | |
|---|---|---|---|
| 591,899 | 10/1897 | Thomson | 378/123 |
| 3,680,959 | 8/1972 | Schuch et al. | 356/313 |
| 3,835,330 | 9/1974 | Baker et al. | 378/119 |
| 3,868,222 | 2/1975 | Barringer | 73/28 |
| 4,042,848 | 8/1977 | Lee | 378/119 |
| 4,201,921 | 5/1980 | McCorkle | 250/493 |
| 4,220,414 | 9/1980 | Barringer | 356/318 |

Primary Examiner—Alfred E. Smith
Assistant Examiner—T. N. Grigsby
Attorney, Agent, or Firm—C. H. Grace; L. G. Vande Zande

[57] ABSTRACT

A system is provided for producing plasma pinch X-rays usable in X-ray lithography. Ionized heated plasma is repeatably generated in a first area directly from solid material without exploding the latter. X-rays are generated in a second area by passing high current through the plasma causing radial inward magnetic field pinching. Accurate control and improved intensity performance, and greater flexibility in selection of X-ray emitting materials, are provided by the separation of the plasma generating and the X-ray pinch generating functions. Common electrode structure is provided for plasma generating and for plasma pinching, which common electrode also provides a cylindrical plasma communication passage from the first to the second area, and provides an X-ray emission passage of desired axial orientation.

23 Claims, 2 Drawing Figures

PLASMA PINCH X-RAY APPARATUS

TECHNICAL FIELD

The invention relates to systems for generating X-rays from plasma, and usable in fine line lithography for semiconductors.

BACKGROUND

The invention arose from efforts to develop an X-ray system for use in manufacturing microelectronic circuits. With the ever increasing miniaturization of semiconductor integrated circuitry, optical lithography does not afford the necessary resolution due to diffraction effects along mask lines. X-ray lithography provides greater resolution due to the shorter wave length of X-rays.

Various types of X-ray sources are known for use in X-ray lithography. These systems are costly, and have not yet achieved a consistently high level of performance and intensity necessary for high production rate lithography. Various of these systems are cumbersome, and are not amenable to repetitive manufacturing sequences.

In the conventional type of X-ray system, a metal target is continuously bombarded by a stream of high energy electrons. Most of the energy is dissipated in the target in the form of heat, while a very small fraction is emitted in the form of relatively high energy X-rays. This type of source system has low intensity and low production rates. The high heat generation requires complicated mechanical designs to dissipate the heat, such as rotating anodes or high velocity water cooling.

In another type of X-ray system, commonly called the gas puff type, a neutral non-ionized gas is pumped in cylindrical form between a pair of electrodes. High current is then passed between the electrodes, which heats and ionizes the gas, thus creating plasma. The high current also causes magnetic field pinching of the plasma to a smaller constricted area, i.e. parallel lines of current create magnetic fields which cause attraction of the current lines toward each other. The magnetic field pinching and compression of the plasma further heats the plasma and causes X-ray emission.

In an alternate gas puff type X-ray system, the cold, neutral gas is pre-ionized, for example electrically, or by radio frequency radiation setting up a standing wave which ionizes the gas. This alternate gas puff system affords better performance, but is extremely costly. Mechanical valving or the like is needed for introduction of the gas, as in the original gas puff system, and there is required the additional equipment for the intermediate pre-ionization stage. Also as in the original gas puff system, the X-ray generating material selection is limited by the requirement that the material be a gas.

In another known X-ray system, called the exploding wire type, high current explodes and vaporizes a circumferential array of wires to a vapor plasma. The high current also causes magnetic field pinching of the vapor plasma, generating X-rays. The same current which generates the plasma also generates the X-rays. The plasma and the X-rays are generated in the same area and at the same time. A drawback of the exploding wire type X-ray system is its one shot nature. The wires must be replaced after each firing, and the system is thus not amenable to cost effective use in manufacturing sequences.

In another type of X-ray system, as shown in McCorkle U.S. Pat. No. 4,201,921, plasma is generated by passing a high current along the inner capillary wall of a hollow tubular insulator. X-rays are generated by directing an electron beam on the plasma.

SUMMARY

An object of the present invention is to provide a simple, low cost X-ray system. Though not limited thereto, the invention is particularly suitable for use in X-ray lithography, including cost effective repetitive manufacturing use.

The invention has been found to afford remarkably superior performance and X-ray intensity. The invention affords plasma pinch X-rays in a particularly simple and effective system. In preferred form, X-ray generation and plasma generation are separated in time and space, and have separate initiating means. Ionized heated plasma is repeatably generated in a first area directly from solid material, as by high current peak discharge from a conductor, or by high current stripping along an insulator. X-rays are generated in a second different area at a second later time and by a different high current causing magnetic field pinching of the plasma.

The system enables accurate control of both plasma generation and X-ray generation. Both are controlled electrically, without mechanical valving and the like as in gas puff type systems. The use of solid material for X-ray generation enables a wide selection of X-ray source material.

DETAILED DESCRIPTION

Figure 1:
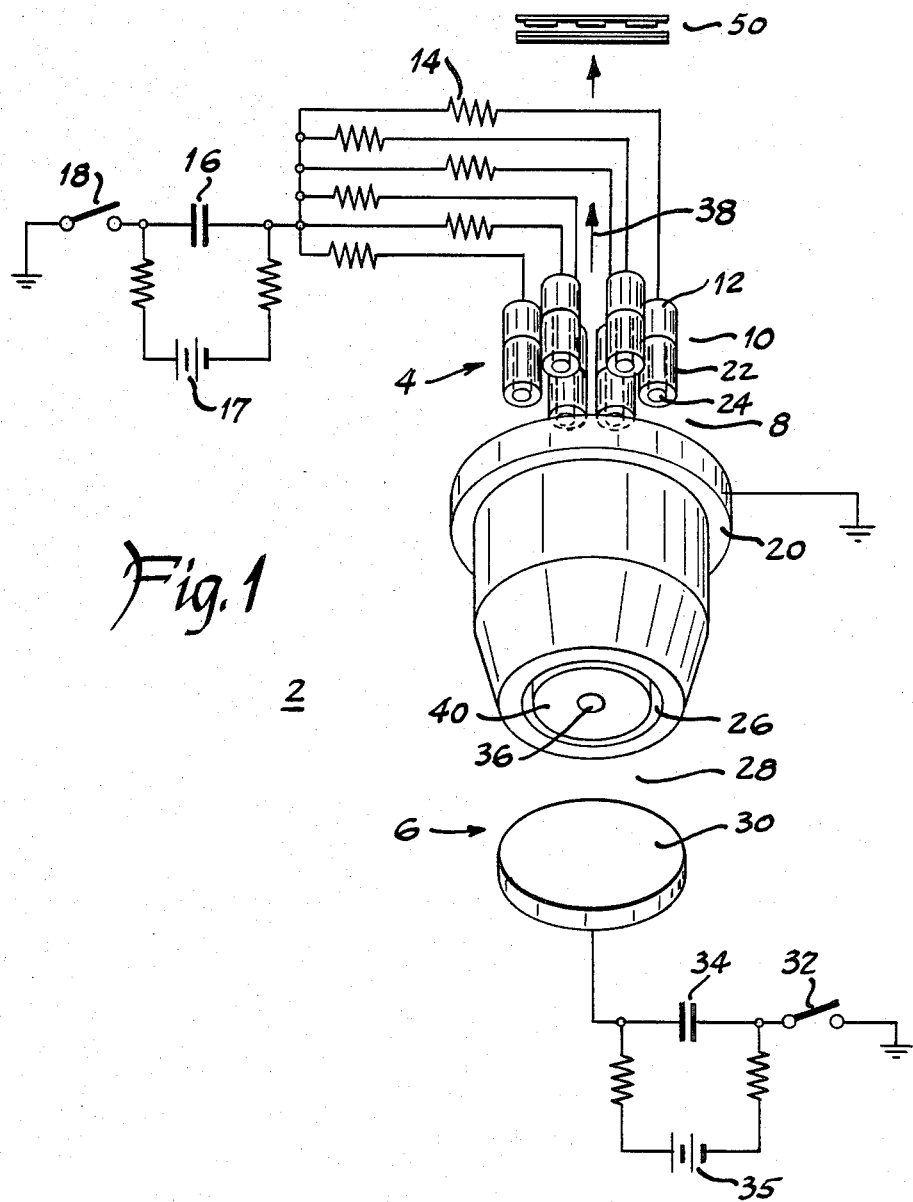
FIG. 1 is a schematic exploded pictorial view of the X-ray system in accordance with the invention.

X-ray system 2 in FIG. 1 includes plasma vapor generating means 4 and X-ray generating means 6. The plasma is generated in a first area 8 by passing high current along solid material means 10. In preferred form, a plurality of circumferentially spaced solid material means 10 afford a cylinder of plasma at an annulus area 8.

Figure 2:
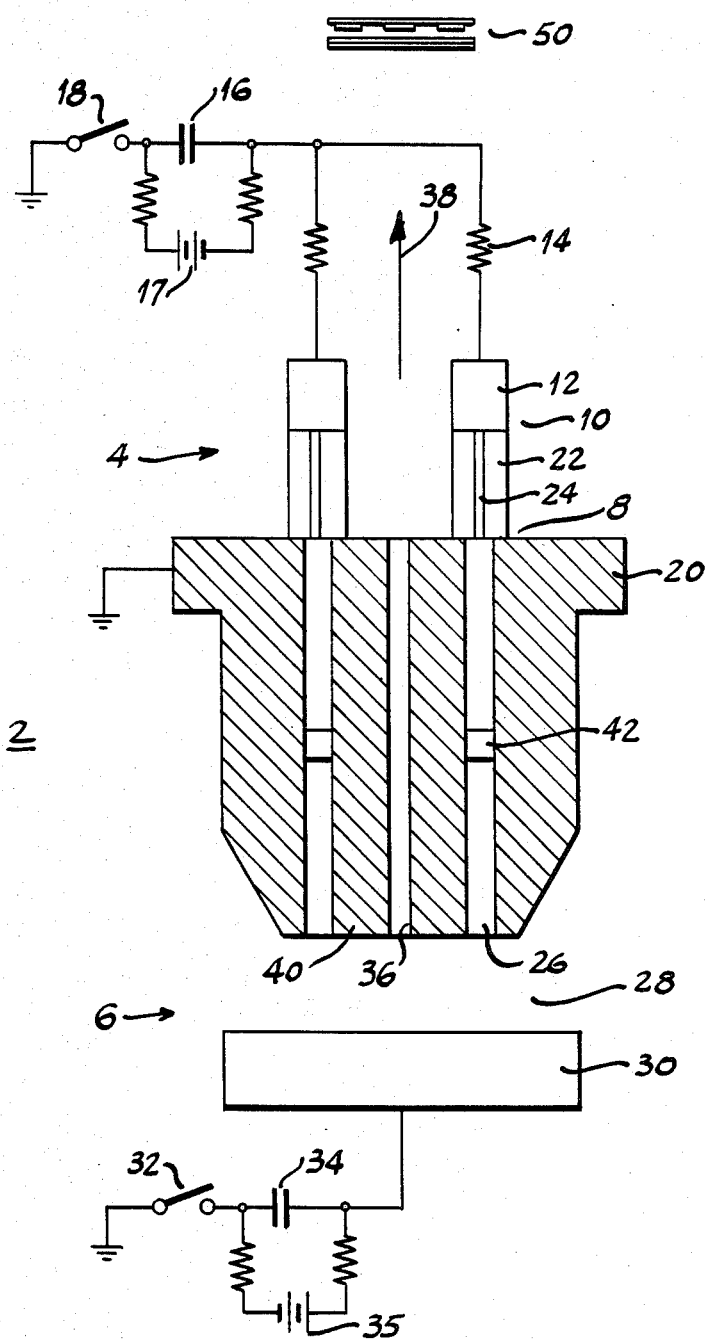
FIG. 2 is a schematic sectional view of the X-ray system of FIG. 1.

In one form, each of the solid material means 10 comprises an electrode 12 connected through a ballast resistor 14 to a source of electrical energy, such as a large storage capacitor 16 charged from voltage source 17. Upon closure of switch 18, capacitor 16 will discharge from electrode 12 across gap 8 to electrode 20. This spark discharge from electrical conductor 12 boils material off the latter to generate plasma in the arc gap 8. Generation of plasma by spark discharge is known. In another form, each of the solid material means 10 further includes electrical insulator means 22 having a central axial passage 24 in the form of a hollow tubular capillary. High current flows from electrode 12 along the inner surface wall of the capillary 24, FIG. 2, and strips or boils material off the latter, generating plasma. Plasma generation by high current stripping along an insulator is known. Alternatively, material 22 may be a conductor, or a semiconductor, e.g. silicon.

The ionized heated plasma in first area 8 is cylindrically communicated through passage 26 to the second area 28. Cylindrical passage 26 through electrode 20 is coaxially aligned with the plurality of circumferentially spaced solid material means 10, such that the plasma is cylindrically generated and communicated. X-ray generating means 6 includes an electrode 30 axially aligned with cylindrical passage 26 and axially spaced from electrode 20 on the opposite side thereof from plasma generating means 4. Electrode 30 may take a variety of forms, including a solid electrode, or a wire mesh screen. Upon closure of switch 32, a large storage capacitor 34 discharges electrode 30 across gap 28 to electrode 20. Capacitor 34 is charged by voltage source 35. This passes high current through the plasma in area 28 causing magnetic field pinching of the plasma radially inwardly. Electrode 20 thus provides a common electrode for plasma generating means 4 and X-ray generating means 6.

Common electrode 20 includes a second passage 36 extending therethrough along the central axis and incentrically to cylindrical passage 26. Passage 36 provides for emit emission of X-rays from second area 28 back through common electrode 20 in a direction opposite to plasma flow. X-rays are emitted as shown at arrow 38.

The plasma may be provided to second area 28 in the form of a solid cylinder, but a hollow cylinder is preferred in order to facilitate easier pinching. In the preferred structure, this hollow cylinder of plasma is provided through cylindrical passage 26. The central electrode portion 40 is supported within passage 26 by radial spokes such as 42, FIG. 2. These spokes also provide the ground return for central portion 40.

In the preferred embodiment, the plasma generating means 4 includes six electrodes 12, circumferentially arranged. Insulating material 22 may be teflon having a length of 0.5 cm and an inner diameter of 1 mm. Hollow cylindrical passage 26 in common electrode 20 has a length of 1 cm, an inner diameter of 4 cm and an outer diameter of 4.6 cm, thus having radial thickness of 3 mm. The central X-ray emission passage 36 has a diameter of 2 mm. The axial gap across area 28 between electrode 20 and electrode 30 is 1 cm. The plasma is pinched radially inwardly to a diameter of about 1 mm in area 28 coaxially aligned with passage 36. The magnetic field pinch collapse occurs within about 50 nanoseconds. The size of capacitors 16 and 34 is 0.2 uf and 0.7 uf respectively. X-ray generating electrode 30 is fired 2 microseconds after plasma generating electrodes 12 are fired.

It is thus seen that in the preferred embodiment, the plasma and the X-rays are generated in different areas and at a different time and with separate currents. The plasma is generated in first area 8, and X-rays are generated in a second area 28. The X-rays are generated sequentially subsequent to generation of the plasma. A first current from electrodes 12 generates the plasma, and a second separate current from electrode 30 generates the X-rays. Ionized heated plasma is repeatably generated in area 8 directly from solid material without exploding the latter.

X-rays are radiated in all directions from pinch area 28. The X-rays are preferably communicated along axis 38 through exit passage 36. Another preferred path for X-ray emission is in the opposite direction along axis 38 through an aperture in electrode 30. The axial emission orientation of the X-rays enables placement of a masked semiconductor substrate 50 normal to axis 38 for impingement by the X-rays.

It is preferred that plasma vapor be generated in area 8, though alternatively other lower energy level vapors may of course be generated directly from the solid material. In a further alternative, when plasma vapor is generated in area 8, the delay or length of travel to area 28 may be long enough that the plasma cools slightly but is still a vapor. In both alternatives, the high current through area 28 heats the vapor up to plasma vapor and causes magnetic field plasma pinching to generate the X-rays.

It is recognized that various modifications are possible within the scope of the appended claims.

We claim:

1. Apparatus for producing X-rays, comprising:
   means for repeatably generating vapor directly from the same piece or pieces of solid material; and
   means including axially spaced electrodes for generating X-rays by passing a high current axially between said axially spaced electrodes through said vapor causing magnetic field plasma pinching radially inwardly perpendicularly to the axial current flow,
   wherein said vapor generating means includes means for repeatably generating plasma vapor by passing high current along solid material means.

2. The invention according to claim 1 wherein said plasma generating means includes electrical conductor spark discharge means.

3. Apparatus for producing X-rays, comprising:
   means for repeatably generating vapor in spaced axial paths directly from solid material; and
   means for generating X-rays by passing a high current axially through said vapor causing magnetic field plasma pinching radially inwardly perpendicularly to the axial current flow;
   wherein said vapor is generated in an annulus in a first region and said X-rays are generated in a second region, the plane in which said annulus lies being perpendicular to the direction of said axial current flow.

4. Apparatus for producing X-rays, comprising:
   means for generating vapor directly from solid material in a first region by passing current along solid material means;
   means providing communication of said vapor to a second region in spaced axial paths; and
   means for generating X-rays in said second region by passing a high current axially through said vapor causing magnetic field plasma pinching radially inwardly perpendicularly to the axial current flow.

5. The invention according to claim 4 wherein said vapor generating means comprises means for repeatably generating plasma directly from solid material by passing high current along said solid material, said current generating said plasma being separate from said current generating said X-rays.

6. The invention according to claim 5 wherein said current generating said plasma is prior in time to said current generating said X-rays.

7. Apparatus for producing X-rays, comprising:
   means for generating vapor;
   means for generating X-rays by passing a high current through said vapor causing radial inward magnetic field plasma pinching to a central axis extending perpendicularly to the direction of said radial pinching; and
   means for communicating said X-rays axially along said central axis.

8. The invention according to claim 7 wherein said vapor generating means comprises means for generating plasma vapor directly from solid material in spaced axial paths.

9. The invention according to claim 7 wherein said vapor is generated in a first region and said X-rays are generated in a second region and comprising means for communicating said vapor axially from said first region to said second region and wherein X-ray communication means is spaced radially inwardly of said vapor communication means.

10. The invention according to claim 7 wherein said vapor generating means comprises means for passing a high current along solid material to generate plasma, said current generating said plasma being separate from said current generating said X-rays.

11. Apparatus for producing X-rays, comprising:
    means for repeatably generating vapor directly from solid material; and
    means including axially spaced electrodes for generating X-rays by passing a high current axially between said axially spaced electrodes through said vapor causing magnetic field plasma pinching radially inwardly perpendicularly to the axial current flow;
    wherein said vapor generating means includes means for repeatably generating plasma vapor by passing high current along solid material means; and
    wherein said plasma generating means includes means for passing high current along electrical insulation means.

12. Apparatus for producing X-rays, comprising:
    means for repeatably generating vapor directly from solid material; and
    means including axially spaced electrodes for generating X-rays by passing a high current axially between said axially spaced electrodes through said vapor causing magnetic field plasma pinching radially inwardly perpendicularly to the axial current flow;
    wherein said vapor is generated in a first region and said X-rays are generated in a second region; and
    wherein said vapor generating means and said X-ray generating means include a common electrode separating said first and second regions, and wherein said common electrode is one of said axially spaced electrodes.

13. The invention according to claim 12 wherein said common electrode further includes passage means providing vapor communication from said first to said second means.

14. The invention according to claim 13 wherein said vapor generating means includes means for repeatably generating said vapor by passing high current along solid material means in spaced axial paths.

15. The invention according to claim 14 comprising a plurality of circumferentially spaced said solid material means to afford a cylinder of said vapor in said first region,
    and wherein said passage means through said common electrode is cylindrical and coaxially aligned with said plurality of circumferentially spaced solid material means.

16. The inventiom according to claim 15 wherein the other of said axially spaced electrodes is axially aligned with said cylindrical passage through said common electrode and axially spaced from said common electrode on the opposite side thereof from said vapor generating means.

17. The invention according to claim 16 wherein said plurality of circumferentially spaced solid material means of said vapor generating means comprise a plurality of electrodes circumferentially spaced around and coaxially aligned with said cylindrical passage through said common electrode and axially spaced from said common electrode on the opposite side thereof from said X-ray generating means.

18. The invention according to claim 17 wherein said plurality of circumferentially spaced solid material means further comprise a plurality of electrical insulation means circumferentially spaced around and coaxially aligned with said cylindrical passage through said common electrode, and axially disposed between said common electrode and a respective one of said plurality of circumferentially spaced electrodes of said vapor generating means, each electrical insulation means having a hollow tubular capillary passage axially therethrough from its respective said electrode to said passage in said common electrode, said vapor being generated along the inner capillary surface of said insulation means.

19. The invention according to claim 17 wherein said vapor is generated by spark discharge from said last mentioned electrodes to said common electrode.

20. The invention according to claim 17 wherein said common electrode includes a second passage extending therethrough along the central axis of and spaced radially inwardly of said first mentioned cylindrical passage, for exit emission of X-rays from said second region back through said second passage in a direction opposite to vapor flow through said first passage.

21. Apparatus for producing X-rays, comprising:
    means for repeatably generating vapor directly from solid material; and
    means including axially spaced electrodes for generating X-rays by passing a high current axially between said axially spaced electrodes through said vapor causing magnetic field plasma pinching radially inwardly perpendicularly to the axial current flow;
    wherein said vapor generating means includes means for repeatably generating plasma vapor by passing high current along solid material means; and
    wherein said high current of said plasma generating means is provided separately from said high current of said X-ray generating means.

22. Apparatus for producing X-rays, comprising:
    means for repeatably generating vapor in spaced axial paths directly from solid material; and
    means for generating X-rays by passing a high current axially through said vapor causing magnetic field plasma pinching radially inwardly perpendicularly to the axial current flow;
    wherein said vapor is generated in an annulus in a first region and said X-rays are generated in a second region, the plane in which said annulus lies being perpendicular to the direction of said axial current flow;
    wherein said first mentioned means generates plasma, and wherein said plasma generating current is separate from said X-ray generating current.

23. Apparatus for producing X-rays comprising in combination:
    means for repeatably generating ionized heated plasma directly from solid material; and means for generating X-rays by passing high current through said plasma causing magnetic field pinching;

wherein said plasma generation and said X-ray generation are separated in time, and are separated in space such that said plasma is generated in a first region and said X-rays are generated in a second region by passing high current axially through said plasma causing radial inward magnetic field plasma pinching perpendicularly to the axial current flow, and wherein said plasma is generated by a first current source and said X-rays are generated by a second current source separate and distinct from said first current source, affording accurate electric control of both plasma generation and X-ray generation.

* * * * *

UNITED STATES PATENT AND TRADEMARK OFFICE
CERTIFICATE OF CORRECTION

PATENT NO. : 4,536,884
DATED : August 20, 1985
INVENTOR(S) : ARNOLD WEISS ET AL

It is certified that error appears in the above-identified patent and that said Letters Patent is hereby corrected as shown below:

In Column 2, line 20, delete "peak" and insert --spark--

In Column 3, line 19, delete "emit" and insert --exit--

In Claim 13, column 5, line 50, delete "means" and insert --region--

In Claim 16, column 5, line 63, delete "inventiom" and insert --invention--

Signed and Sealed this

Sixteenth Day of September 1986

[SEAL]

Attest:

DONALD J. QUIGG

Attesting Officer     Commissioner of Patents and Trademarks